US012782980B2

(12) United States Patent
Lutwak et al.

(10) Patent No.: US 12,782,980 B2
(45) Date of Patent: Nov. 3, 2026

(54) APPARATUS FOR CONTROLLING VAPOR PRESSURE OF A SUBJECT MATERIAL CONTAINED THEREIN, AND RELATED METHODS AND SYSTEMS

(71) Applicant: Microchip Technology Incorporated, Chandler, AZ (US)

(72) Inventors: Robert Lutwak, Pelham, MA (US); Lichung Ha, Wakefield, MA (US); Bomy Chen, Newark, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 18/933,912

(22) Filed: Oct. 31, 2024

(65) Prior Publication Data

US 2025/0298426 A1 Sep. 25, 2025

Related U.S. Application Data

(60) Provisional application No. 63/568,070, filed on Mar. 21, 2024.

(51) Int. Cl.
*G04F 5/14* (2006.01)
*C23C 16/04* (2006.01)
*G05D 16/04* (2006.01)

(52) U.S. Cl.
CPC ........... *G05D 16/04* (2013.01); *C23C 16/045* (2013.01); *G04F 5/14* (2013.01)

(58) Field of Classification Search
CPC ...... C23C 16/045; G01N 21/03; G01N 21/11; G04F 5/14; G04F 5/145; H03L 7/26; H03B 17/00
See application file for complete search history.

(56) References Cited

U.S. PATENT DOCUMENTS 9,755,654 B2 * 9/2017 Nakajima ............... G04F 5/145
2013/0015920 A1 * 1/2013 Sato ........................... H03L 7/26 29/592.1
2013/0047417 A1 * 2/2013 Nagasaka ............... H01L 23/10 29/592.1
2018/0212612 A1 * 7/2018 Park .................. H01L 21/02532
2021/0310945 A1 * 10/2021 Akagi ................ G01N 21/7743
2022/0290294 A1 * 9/2022 Takahashi ............... C23C 16/34
2023/0020554 A1 1/2023 Lutwak
(Continued)

FOREIGN PATENT DOCUMENTS

CN 108793059 B 2/2021
WO 2023/287455 A1 1/2023
WO 2023/086119 A1 5/2023

OTHER PUBLICATIONS

International Search Report of International Application No. PCT/US2023/082577, mailed Aug. 8, 2024, 3 pages.
(Continued)

*Primary Examiner* — Levi Gannon
(74) *Attorney, Agent, or Firm* — TraskBritt

(57) ABSTRACT

An apparatus includes a body having walls defining a cavity therebetween, the cavity containing an amount of a subject material therein. A channel structure including a channel substrate with channels having a substantially uniform width formed therein is disposed along a portion of the walls of the body, and a liner material is disposed over portions of internal surfaces of the channels.

23 Claims, 8 Drawing Sheets

(56) References Cited

U.S. PATENT DOCUMENTS

| | | | |
|---|---|---|---|
| 2023/0143437 | A1 | 5/2023 | Lutwak et al. |
| 2023/0421163 | A1 | 12/2023 | Lutwak et al. |

OTHER PUBLICATIONS

Written Opinion of the International Searching Authority of International Application No. PCT/US2023/082577, mailed Aug. 8, 2024, 5 pages.

International Search Report of International Application No. PCT/US2024/054067, mailed Feb. 24, 2025, 3 pages.

Written Opinion of the International Searching Authority of International Application No. PCT/US2024/054067, mailed Feb. 24, 2025, 6 pages.

* cited by examiner

APPARATUS FOR CONTROLLING VAPOR PRESSURE OF A SUBJECT MATERIAL CONTAINED THEREIN, AND RELATED METHODS AND SYSTEMS

CROSS-REFERENCE TO RELATED APPLICATION

This application claims the benefit under 35 U.S.C. § 119(e) of U.S. Provisional Patent Application Ser. No. 63/568,070, filed Mar. 21, 2024, the disclosure of which is hereby incorporated herein in its entirety by this reference.

STATEMENT REGARDING FEDERALLY SPONSORED RESEARCH OR DEVELOPMENT

This invention was made with government support under W911NF2120016 awarded by U.S. Army Research Laboratory. The government has certain rights in the invention.

FIELD

This disclosure relates generally to an apparatus for controlling vapor pressure of a subject material contained therein, and related methods and systems.

BACKGROUND

Vapor pressure is affected by surface tension according to the Kelvin equation:

$$\frac{P}{P_{sat}} = e^{2\gamma V_m / rRT},$$

where $P/P_{sat}$ is the ratio of the vapor pressure to the saturation pressure, $\gamma$ is the surface tension, $V_m$ is the molar volume of the liquid, r is the radius of the droplet, R is the universal gas constant, and T is the absolute temperature. Vapor pressure is relevant in a variety of operational contexts including, without limitation, atomic clocks and atomic sensors.

BRIEF SUMMARY

In various examples, an apparatus includes a body having walls defining a cavity therebetween, the cavity containing an amount of a subject material therein. A channel structure including a channel substrate with channels having a substantially uniform width formed therein is disposed along a portion of the walls of the body, and a liner material is disposed over portions of internal surfaces of the channels.

In other examples, a method includes: forming an apparatus including a body having walls defining a cavity therebetween, the cavity having an amount of a subject material contained therein; forming a channel structure from a channel substrate formed of silicon and having channels with a substantially uniform width of about 1,000 nanometers formed therein, the channel structure disposed along a portion of one or more of the walls of the apparatus; and, forming a liner material comprising a uniform thickness from platinum over portions of internal surfaces of the channels, wherein the subject material exhibits a reduced wetting angle on the liner material which is less than a wetting angle of the subject material on the channel substrate.

In still other examples, a system includes an emitter positioned and oriented to direct radiation into and through an apparatus. The apparatus includes a body having walls and windows defining a cavity therebetween and an amount of a subject material disposed in the cavity. A channel structure including a channel substrate with channels having a substantially uniform width formed therein is disposed along a portion of the walls. A liner material having a uniform thickness is disposed over internal surfaces of the channels, wherein the subject material exhibits a wetting angle on the liner material which is less than a wetting angle of the subject material on the channel substrate. A detector is positioned and oriented to detect the radiation directed into and through the windows of the apparatus.

BRIEF DESCRIPTION OF THE DRAWINGS

While this disclosure concludes with claims particularly pointing out and distinctly claiming specific examples, various features and advantages of examples within the scope of this disclosure may be more readily ascertained from the following description when read in conjunction with the accompanying drawings. In the drawings:

DETAILED DESCRIPTION

Figure 1:
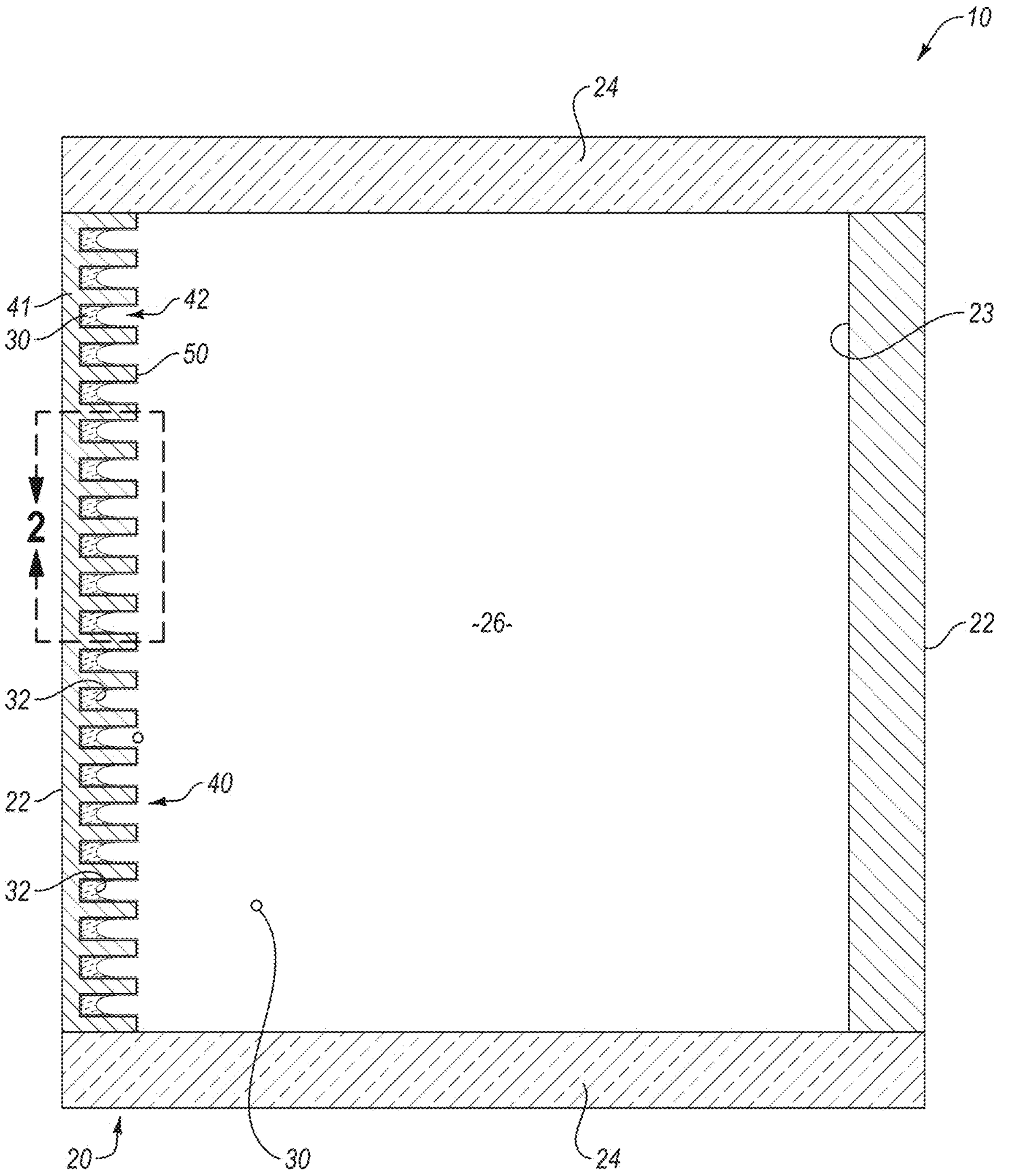
FIG. 1 is a schematic cross-sectional view of one example of an apparatus for controlling vapor pressure of a subject material contained therein, in accordance with examples of the disclosure.

The illustrations presented in this disclosure are not meant to be actual views of any apparatus for controlling vapor pressure of a subject material contained therein, components thereof, or related systems or methods, but are merely idealized representations employed to describe illustrative examples. Thus, the drawings are not necessarily to scale. In addition, certain actions in flowcharts are depicted in dashed lines to clearly indicate that those actions are "optional," however, such labeling is not to be interpreted to mean that the other actions in flowcharts depicted in solid lines are required, critical, or otherwise necessary in connection with a given example.

As used herein, the term "about," when in reference to a numerical value for a particular parameter, is inclusive of the numerical value and a degree of variance from the numerical value that one of ordinary skill in the art would understand is within acceptable tolerances for the particular parameter. For example, "about," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0 percent met, at least 95.0 percent met, at least 99.0 percent met, or even at least 99.9 percent met.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means "some or a totality." As used herein, the term "each and every" means a "totality."

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one," "one or more" and "more than one" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more" or "more than one," without limitation); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, without limitation" or "one or more of A, B, and C, without limitation" is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

The term "channel," as used herein, means and includes a surface feature having an average dimension (e.g., average width, without limitation) of from about 5 nanometers (nm) to about 5 micrometers (μm), which micrometers may be called microns, without limitation, that may be measured in a direction perpendicular to surfaces (e.g., sidewalls, without limitation) of the channel which partially define an opening (e.g., open top, without limitation) into the channel, and which is exposed to a subject material contained in an apparatus. For example, a "channel" may be configured as a three-dimensional void within a material (e.g., container wall, channel substrate, without limitation) that may be occupied by environmental fluids (e.g., air, inert gas, without limitation). A "channel" may include an elongated configuration disposed along a portion of an internal surface of a wall of an apparatus, such as along an entire length or an entire width of an internal surface of a wall of an apparatus, without limitation. A "channel" may extend along a portion of an internal surface of more than one wall of an apparatus. In various examples, a "channel" may be disposed continuously along an entire length or an entire width of the internal surfaces of all of the walls of an apparatus, such as along the entire length or the entire width of the internal surfaces of all of the walls of the apparatus, thereby forming a "continuous channel" disposed along and around the entirety of the length or width of the internal surfaces of the walls of an apparatus, without limitation. A "channel" may extend in a linear (e.g., substantially linear, without limitation) configuration or in a curvilinear configuration along a portion of an internal surface of a wall of an apparatus.

The term "microchannel," as used herein, means and includes a "channel" having an average dimension (e.g., average width, without limitation) of from about 1 micron to about 5 microns, without limitation, that may be measured in a direction perpendicular to surfaces (e.g., sidewalls, without limitation) of the channel which partially define an opening (e.g., open top, without limitation) into the channel, and which is exposed to a subject material contained in an apparatus.

The term "nanochannel," as used herein, means and includes a "channel" having an average dimension (e.g., average width, without limitation) of from about 5 nm to about 1,000 nm (i.e., about 1 micron, without limitation), that may be measured in a direction perpendicular to surfaces (e.g., sidewalls, without limitation) of the channel which partially define an opening (e.g., open top, without limitation) into the channel, and which is exposed to a subject material contained in an apparatus.

Unless the context indicates otherwise, removal of materials or surface modifications described herein may be accomplished by any suitable technique including, but not limited to, etching (e.g., dry etching, wet etching, vapor etching, deep reactive ion etching (DRIE)), ion milling, abrasive planarization (e.g., chemical-mechanical planarization (CMP)), or other such methods.

Disclosed examples relate generally to an apparatus (e.g., vapor cell, atomic sensor, atomic clock, such as a chip-scale atomic clock, atomic magnetometer, such as a chip-scale atomic magnetometer, atomic gyroscope, without limitation) which may, as a nonlimiting example, for which reliable operation may be enabled over a broader (e.g., increased, without limitation) temperature range. More specifically, disclosed examples relate to an apparatus for controlling (e.g., suppressing, without limitation) the vapor pressure of a subject material (e.g., alkali-metals, such as cesium, alkaline earth metals, such as strontium, or other metals, such as ytterbium, without limitation) contained therein, thereby increasing the temperature range over which reliable operation may be achieved. For example, at least a portion of an internal surface of at least one wall of an apparatus may include a porous construction having one or more channels sized, shaped, and positioned to control (e.g., suppress, without limitation) the vapor pressure of the subject material contained in the apparatus. Such vapor pressure control may increase the temperature range over which reliable operation may be enabled.

Some specific, non-limiting examples of a porous construction may involve modifying the surface of at least the portion of the internal surface(s) of the wall(s) of the apparatus (e.g., vapor cell, atomic sensor, atomic clock, such as a chip-scale atomic clock, atomic magnetometer, such as a chip-scale atomic magnetometer, atomic gyroscope, without limitation) to form one or more channels therein. Additionally, or alternatively, at least one channel structure having one or more channels formed therein may be placed in an apparatus to control (e.g., suppress, without limitation) the vapor pressure of the subject material (e.g., alkali-metals, such as cesium, alkaline earth metals, such as strontium, or other metals, such as ytterbium, without limitation) contained therein. Other specific, nonlimiting examples may, additionally or alternatively, reduce performance degradation of an apparatus when operated in high temperature environments (e.g., 90 °C or higher, 120 °C or higher, 150 °C or higher, 200 °C or higher, without limitation).

The upper operating temperature of atomic sensors and atomic clocks, such as chip scale atomic clocks (CSACs), without limitation, may be limited by excessive optical absorption and collisional line broadening due to the high density of the vapor of the subject material (e.g., alkali-metals, such as cesium, alkaline earth metals, such as strontium, or other metals, such as ytterbium, without limitation) at elevated temperatures (e.g., 90 °C or higher, 120 °C or higher, 150 °C or higher, 200 °C or higher, without limitation). The vapor pressure above a liquid may be suppressed by altering the shape of the exposed surface of the liquid, such as, for example, by containing the liquid within a channel of a channel construction (e.g., a channel structure, without limitation). Such a process may be applicable for depressing the vapor pressure of the subject material. In accordance with the Kelvin equation, a radius of a droplet is positive when the curvature of the droplet of a subject liquid is convex, such as is exhibited when the vapor pressure is greater than the saturation pressure. When the curvature of the droplet is concave, the radius of the droplet is negative, such as is exhibited when the vapor pressure is less than the saturation pressure. In addition, when the vapor pressure is less than the saturation pressure, the subject material may exhibit more consistent and reliable behavior across a greater range of operating temperatures (e.g., from about-45 degrees Celsius (°C) to about 250 °C, without limitation), such as, for example, at higher operating temperatures (e.g., 90 °C or higher, 120 °C or higher, 150 °C or higher, 200 °C or higher, without limitation).

Reducing the vapor pressure of the subject material (e.g., alkali-metals, such as cesium, alkaline earth metals, such as strontium, or other metals, such as ytterbium, without limitation) contained in the apparatus (e.g., vapor cell, atomic sensor, atomic clock, such as a chip-scale atomic clock, atomic magnetometer, such as a chip-scale atomic magnetometer, atomic gyroscope, without limitation) may be achieved by introducing at least one channel which, combined with the surface tension of the subject material in the at least one channel, alters the shape of the exposed surface (e.g., meniscus, without limitation) of the subject material in the at least one channel. Stated another way, the interaction between the subject material and the size and shape of the channel (e.g., average width, without limitation) at a particular temperature and pressure causes the shape of the exposed surface of the subject material to change (e.g., introduces a disturbance, without limitation) in a desired manner as compared to the shape of the exposed surface of the subject material when disposed on a level (e.g., substantially level, without limitation) nonporous (e.g., substantially nonporous, without limitation) surface at the same temperature and pressure.

FIG. 1 is a schematic cross-sectional view of one example of an apparatus 10 for controlling vapor pressure of a subject material contained therein, in accordance with examples of the disclosure. The apparatus 10 may include, for example, a body 20 which includes (e.g., defines, partially defines, without limitation) a cavity 26 therein. The cavity 26 may be sized and shaped to contain an amount of a subject material 30 (e.g., alkali-metals, such as cesium, alkaline earth metals, such as strontium, or other metals, such as ytterbium, without limitation) therein. The body 20 may include walls 22 which form one or more sides (e.g., boundaries, without limitation) of the body 20 and windows 24 disposed between the walls 22 which form the remaining sides of the body 20. In various examples, the windows 24 are oppositely disposed from one another, as in FIG. 1. The walls 22 and windows 24 collectively define (e.g., partially define, without limitation) the cavity 26 in body 20. The windows 24 may be formed of a transparent (e.g., substantially transparent, without limitation) material or a translucent (e.g., substantially translucent, without limitation) material, while the walls 22 may be formed of an opaque (e.g., substantially opaque, without limitation) material.

In various examples, the windows 24 are formed of a transparent or translucent borosilicate glass material enabling one or more wavelengths of radiation directed to the cavity 26, and more particularly, directed to the subject material 30 (e.g., alkali-metals, such as cesium, alkaline earth metals, such as strontium, or other metals, such as ytterbium, without limitation) contained in the cavity 26, to pass through the windows 24 and into and through the cavity 26 of the apparatus 10. For example, the transparency of the material of the windows 24 may be such that at least about 10 percent of radiation directed toward the cavity 26, more particularly, directed toward the subject material 30 contained in the cavity 26, passes through the windows 24. More specifically, the transparency of the material of the windows 24 may be such that from about 10 percent to about 99 percent of the radiation directed toward the subject material 30 contained in the cavity 26 passes through the windows 24. As a specific, nonlimiting example, the transparency of the material of the windows 24 may be, for example, such that from about 20 percent to about 95 percent (e.g., about 20 percent, or about 50 percent, or about 75 percent, or about 95 percent, without limitation) of the radiation directed toward the subject material 30 contained in the cavity 26 passes through the windows 24 and into and through the cavity 26 of the apparatus 10.

Figure 2:
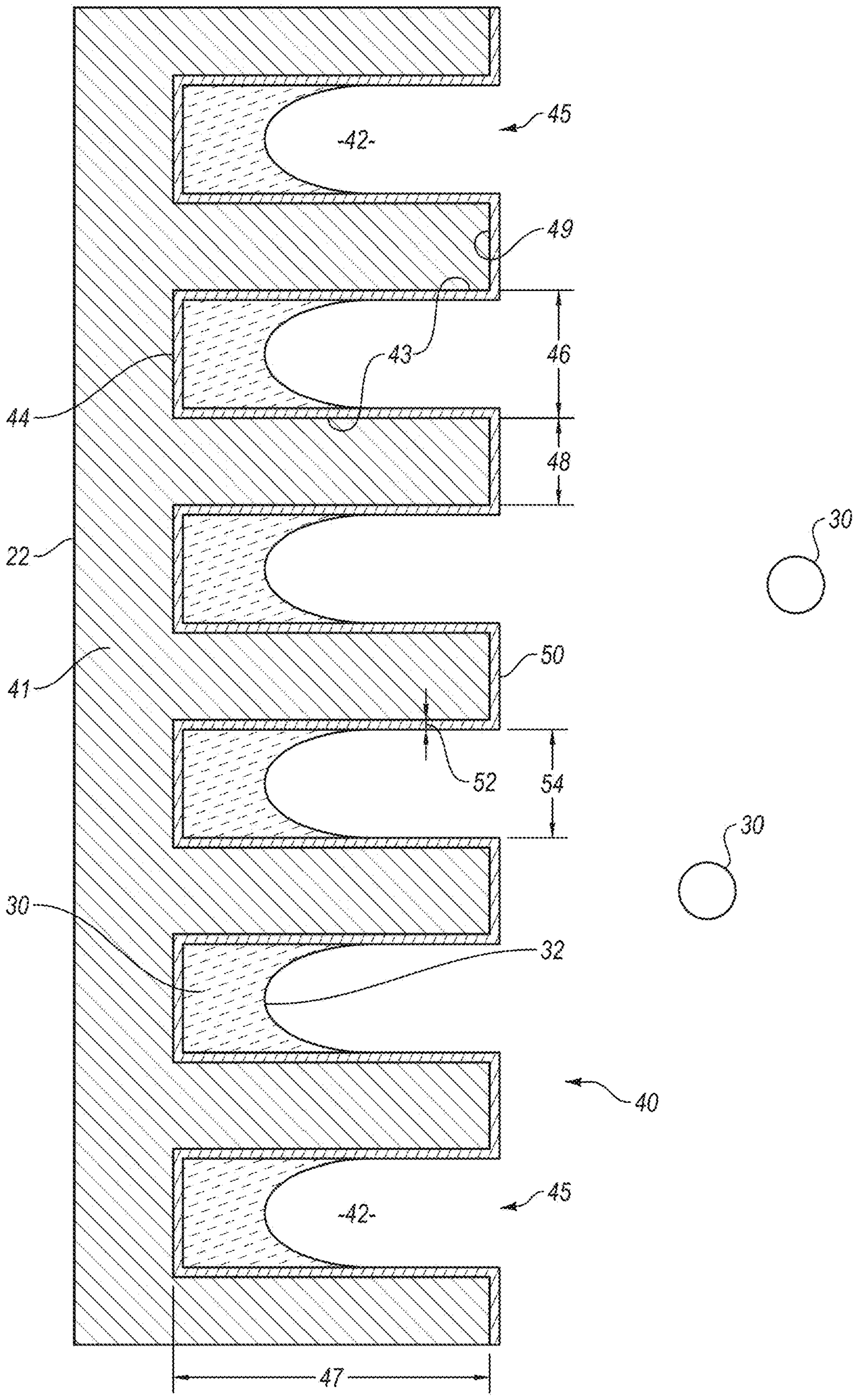
FIG. 2 is an enlarged schematic cross-sectional view of the portion of the apparatus of FIG. 1 enclosed by dashed box 2, in accordance with examples of the disclosure.

An apparatus 10 in accordance with examples of the disclosure includes one or more channels 42 formed therein. The channels 42 include oppositely disposed sidewalls 43 which partially define an open top 45 (e.g., opening, without limitation) into a respective channel 42 which is exposed to a subject material 30 (e.g., alkali-metals, such as cesium, alkaline earth metals, such as strontium, or other metals, such as ytterbium, without limitation) contained in the cavity 26 of the apparatus 10. The oppositely disposed sidewalls 43 extend between a closed bottom 44 and the open top 45, defining a depth 47 of the respective channel 42 therebetween, as shown in FIG. 2. In some embodiments, the sidewalls 43 extend between a closed bottom 44 and the open top 45 of the respective channel 42 parallel (e.g., substantially parallel, without limitation) with one another. The channels 42 also include a width 46 measured in a direction perpendicular to the sidewalls 43 of the respective channel 42, as also shown in FIG. 2. The width 46 partially defines one dimension (e.g., average width, without limitation) of the open top 45 of the respective channel 42 which is exposed to the subject material 30, and through which the subject material 30 may pass into the respective channel 42. In accordance with various examples of the disclosure, the width 46 (e.g., average width, without limitation) of the channels 42 may be from about 5 nm to about 5 μm, without limitation. In various examples, the channels 42, and thus, the open tops 45 thereof, may have a width 46 (e.g., average width, without limitation) of from about 1 micron to about 5 microns, so as to form microchannels, without limitation. In other examples, the channels 42, and again, the open tops 45 thereof, may have a width 46 (e.g., average width, without limitation) of from about 5 nm to about 1 micron, so as to form nanochannels, without limitation.

Figure 3:
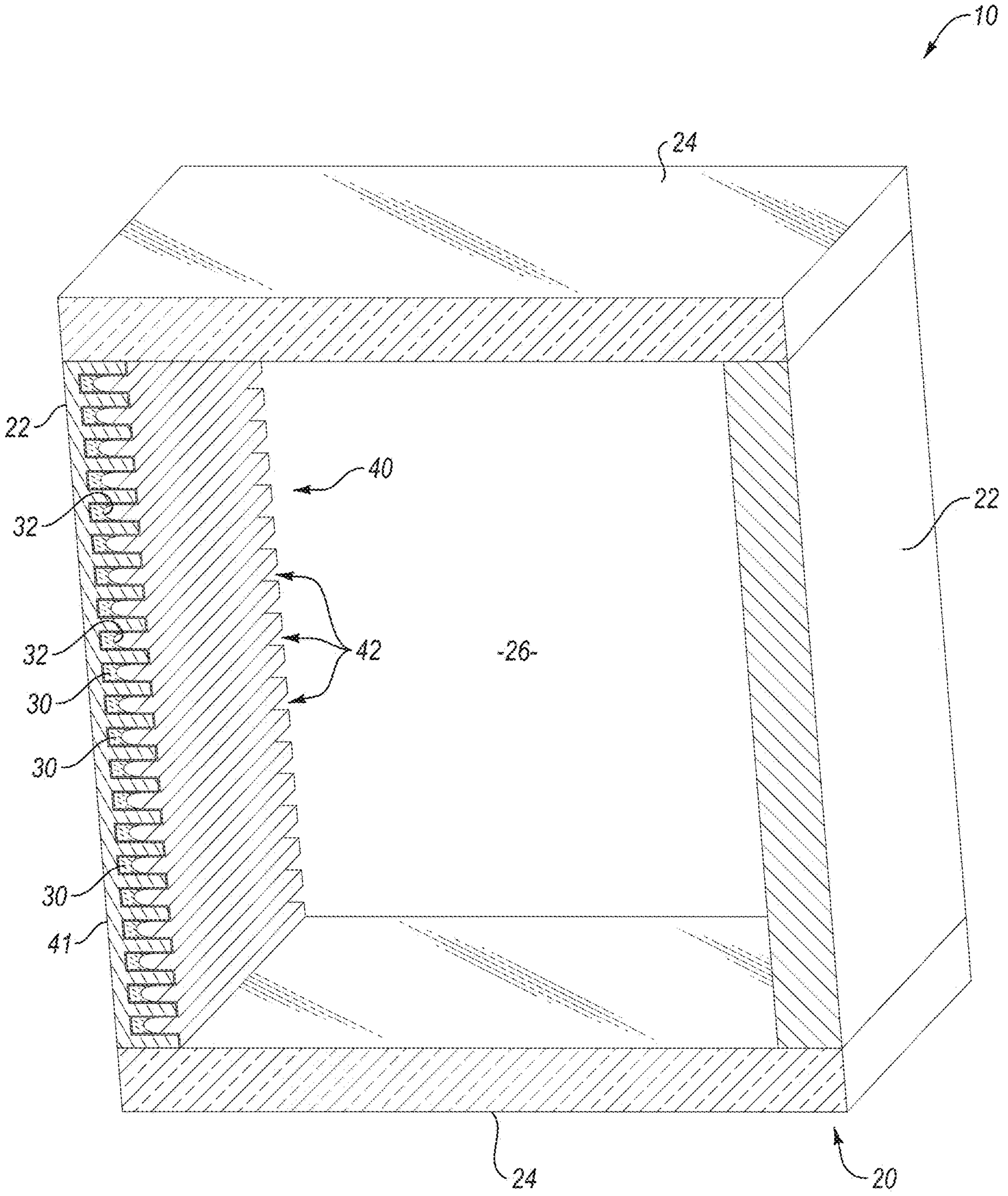
FIG. 3 is a perspective view of the apparatus of FIG. 1, in accordance with examples of the disclosure.

The channels 42 may extend along a portion of the internal surface 23 of one or more of the walls 22 of an apparatus 10, such as along the entire length (e.g., along substantially the entire length, without limitation) or the entire width (e.g., along substantially the entire width, without limitation) of the internal surface 23 of one or more walls 22 of the apparatus 10. In various examples, the channels 42 may extend along the entire lengths or the entire widths of the internal surfaces 23 of all of the walls 22 of the apparatus 10, thereby forming channels 42 which are continuous (e.g., substantially continuous, without limitation) and which extend along the entirety of the length or width of the internal surfaces 23 of all of the walls 22 of the apparatus 10. The channels 42 may extend in a linear (e.g., substantially linear, without limitation) configuration along the portion of the internal surface 23 of the wall 22 of the apparatus 10, such as is shown best in FIG. 3. In various examples, the channels 42 may extend in a curvilinear (e.g., substantially non-linear, without limitation) configuration along the portion(s) of the internal surface(s) 23 of the wall(s) 22 of the apparatus 10.

In various examples, the apparatus 10 includes a channel structure 40 having channels 42 formed therein, such as is shown in FIGS. 1 through 4. The channel structure 40 may be disposed on a portion of the internal surface 23 of one of the walls 22 of the apparatus 10, such that the channels 42 and, more particularly, the open tops 45 thereof, are exposed to the subject material 30 (e.g., alkali-metals, such as cesium, alkaline earth metals, such as strontium, or other metals, such as ytterbium, without limitation) contained in the cavity 26 of the apparatus 10 to allow amounts of the subject material 30 to migrate into the channels 42. In various examples, the channel structure 40 having the channels 42 formed therein is integral with a respective wall 22 of the apparatus 10, which partially defines the cavity 26, and is exposed to the subject material 30 contained in the cavity 26, such as is shown by way of example in FIGS. 1 through 4.

In other examples, the channel structure 40 forms a respective wall 22 of the apparatus 10 itself and partially defines the cavity 26. For example, a material of the relevant portion or portions of a respective wall 22 may have one or more channels 42 formed directly therein with the channels 42 exposed to the subject material 30 contained in the cavity 26. More specifically, the portion of the respective wall 22 may be subjected to a process different from processing a remainder of the walls 22 of the apparatus 10 to form the channels 42 directly into the respective wall 22. In various examples, an array of microchannels, an array of nanochannels, or an array of microchannels and nanochannels, without limitation, is formed in a respective wall 22 of the apparatus 10. As a specific, nonlimiting example, the portion or portions of the respective wall 22 may be subjected to surface roughening or another material removal process (e.g., sand blasted, etched, ground, without limitation) to form the channels 42 in the portion or portions of the respective wall 22, while the remainder of the respective walls 22 are not subjected to any material removal process, such that the remainder of the respective walls 22 are substantially free of channels 42. Selective formation of channels 42 in a given portion of a respective wall 22 may be accomplished by, for example, an aluminum hard mask employed to form one or more channels 42 in the respective wall 22 with the desired size, shape, and configuration. In one non-limiting example, the surface roughness of the portion of the respective wall 22 exhibiting one or more channels 42 may be from about 5 nm to about 1 micron.

By way of additional example, one or more channels 42 may be formed by providing a non-oxide material (e.g., silicon, silicon wafer, without limitation) alternating with an oxide material (e.g., silicon dioxide, without limitation) between regions of the non-oxide material, portions of the non-oxide material being removed relative to the oxide material to form recesses (e.g., channels 42, without limitation) therebetween. This may be accomplished by, for example, alternately growing the oxide material and non-oxide materials on a wafer. For example, silicon dioxide may be alternately grown with silicon on a silicon wafer through epitaxy, providing selective control of the width 46 and depth 47 of the channels 42 to be formed by partial removal of regions of the non-oxide material. Two or more wafers or substrates having the alternating regions of oxide and recessed non-oxide materials (e.g., channels, without limitation) facing one another may be bonded to one another by surface bonding techniques. Channels 42 may be formed in the non-oxide material utilizing, for example, a selective etch (e.g., HF etch, without limitation) to remove portions of the non-oxide material while leaving the oxide material, providing selective control over the width 46 and depth 47 of the channels 42.

Figure 4:
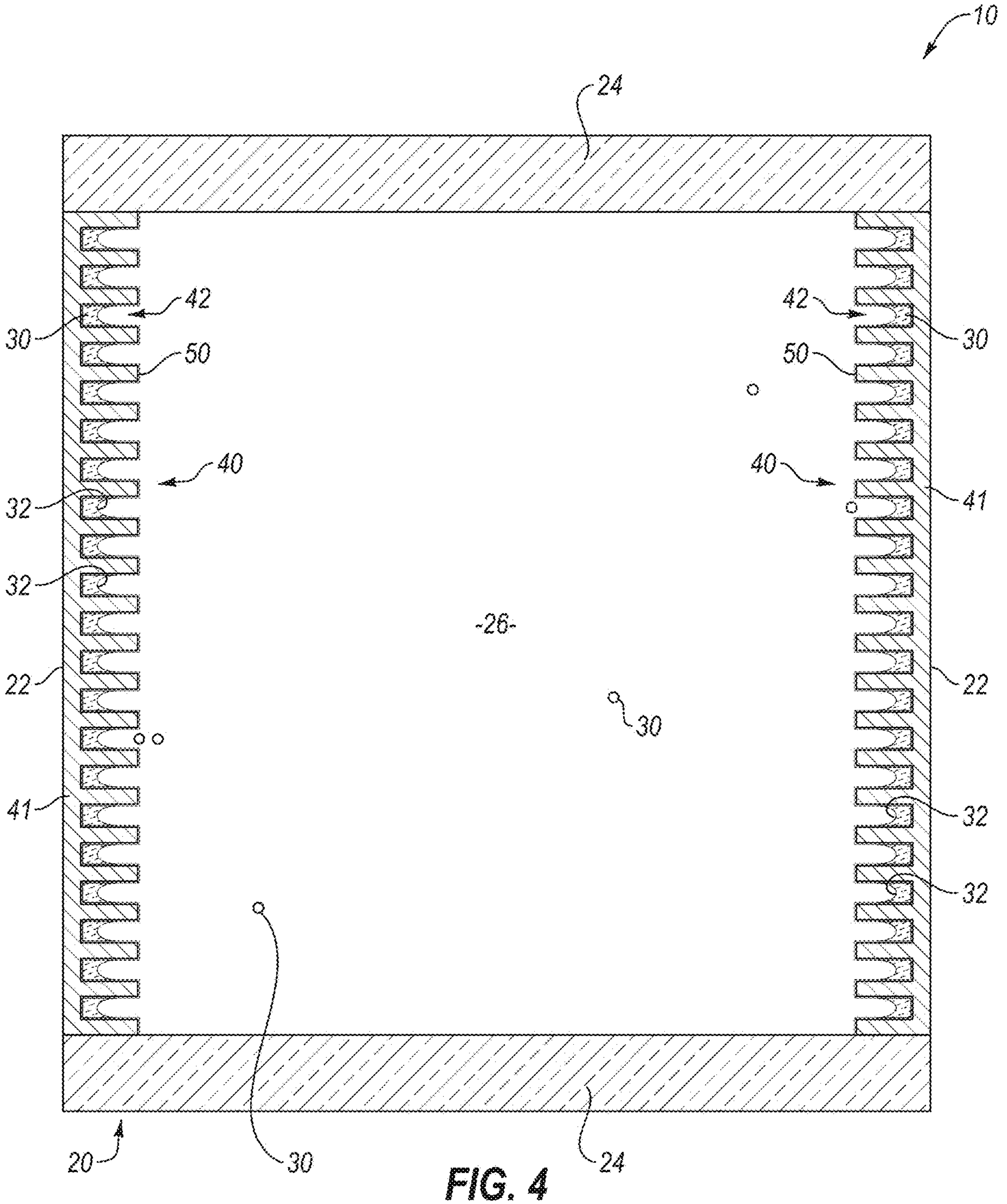
FIG. 4 is a schematic cross-sectional view of one other example of an apparatus for controlling vapor pressure of a subject material contained therein, in accordance with examples of the disclosure.

In various examples, channel structures 40 are disposed on portions of different respective walls 22 at least partially defining the cavity 26, as shown in FIG. 4. As before, the channel structures 40 include channels 42 formed therein to control (e.g., suppress, without limitation) the vapor pressure of the subject material 30 (e.g., alkali-metals, such as cesium, alkaline earth metals, such as strontium, or other metals, such as ytterbium, without limitation). The channel structures 40 are disposed on portions of different respective walls 22 such that the channels 42 are exposed to the subject material 30 contained in the cavity 26 of the apparatus 10. The channels 42 may be positioned along portions of the different respective walls 22 so as not to interfere with a path of radiation (e.g., beams of radiation, without limitation) between a source and a detector in an apparatus 10 (e.g., vapor cell, atomic sensor, atomic clock, such as a chip-scale atomic clock, atomic magnetometer, such as a chip-scale atomic magnetometer, atomic gyroscope, without limitation). More specifically, the channels 42 formed in the channel structure 40 are positioned on the different respective walls 22 at least partially defining the cavity 26, while the channels 42 formed in the channel structure 40 are omitted from the transparent windows 24 further defining the cavity 26, such as is shown, by way of example, in FIG. 4.

The apparatus 10 may be sized and shaped to enable wavelengths of radiation (e.g., beams of radiation, without limitation) to pass through one or more windows 24 of the body 20 and into and through the cavity 26. For example, the oppositely disposed windows 24 of the body 20 may enable radiation of one or more wavelengths or wavelength spectra to pass through the windows 24 and into and through the cavity 26 containing the subject material 30 (e.g., alkali-metals, such as cesium, alkaline earth metals, such as strontium, or other metals, such as ytterbium, without limitation) while the apparatus 10 is in operation. More specifically, the windows 24 may include a material (e.g., a transparent or translucent borosilicate glass, without limitation) which is translucent or transparent (e.g., substantially transparent or translucent, without limitation) to radiation (e.g., in the visible spectrum, infrared radiation, ultraviolet radiation, microwave radiation, without limitation) directed toward the subject material 30 contained in the cavity 26 of the body 20 of the apparatus 10.

The cavity 26 may be sized and shaped to contain an amount of the subject material 30 (e.g., alkali-metals, such as cesium, alkaline earth metals, such as strontium, or other metals, such as ytterbium, without limitation), wherein a portion of the subject material 30 may be in a vapor state and may be impacted by radiation directed toward the cavity 26 and transmitted through the window(s) 24 of the apparatus 10, while the apparatus 10 is in operation. A cross-sectional shape of the apparatus 10 may be any suitable geometric configuration (e.g., square, rectangular, circular, oval, polygonal, or irregular, without limitation). The cavity 26 of the apparatus 10 may have a volume of, for example, about 10,000 cubic millimeters ($mm^3$) or less, without limitation. More specifically, as a nonlimiting example, the volume of the cavity 26 of the apparatus 10 may be from about 0.1 $mm^3$ to about 10,000 $mm^3$ (e.g., about 0.1 $mm^3$, about 1 $mm^3$, about 10 $mm^3$, about 100 $mm^3$, about 1,000 $mm^3$, about 10,000 $mm^3$, without limitation). In various examples, the cavity 26 is sealed (e.g., hermetically sealed, without limitation) after the amount of subject material 30 is added thereinto.

In the examples illustrated in FIGS. 1 through 4, the cavity 26 of the apparatus 10 is enclosed by the walls 22 and the windows 24. As shown in FIGS. 1 through 4, the windows 24 are positioned on opposing sides at least partially defining the cavity 26, with the walls 22 oriented perpendicular to, and extending between, the windows 24. In other examples, the apparatus 10 may include fewer or more windows 24 (e.g., one side formed as a window, all sides formed as windows, without limitation). In still other examples, the walls 22 may be oriented at an oblique angle or may curve relative to the window 24 or windows 24, or the walls 22 may be located in the same plane as one or more of the corresponding window 24 or windows 24, or any combination or subcombination of these features may be present, without limitation.

As illustrated in FIGS. 1 through 4, the channels 42 may be formed directly in one or more of the walls 22 at least partially defining the cavity 26. In various examples, the material of the walls 22 may define the channels 42. In other examples, the material of the walls 22 (e.g., silicon dioxide, without limitation) may be modified when forming the channels 42, such that the material defining the channels 42, such as the channel substrate 41 (e.g., silicon, silicon wafer, without limitation), may be different from the material forming a remainder of the material of the walls 22, the windows 24, or both, without limitation. More specifically, a process for forming the channels 42 may alter the material composition of the walls 22, thereby forming the channels 42, or the material of the walls 22 defining the channels 42 may be deliberately altered following formation of the channels 42.

The channels 42 may also be formed by a process wherein a channel substrate material (e.g., silicon, silicon wafer, without limitation) is etched (e.g., deep reactive-ion etching (DRIE), without limitation) to a predefined width or depth (e.g., uniform width, substantially uniform width, uniform depth, substantially uniform depth, without limitation), for example, a width or depth of from about 10 nm to about 10,000 nm, such as about 1,000 nm, along a length thereof. Subsequent to etching the channel substrate material, it may be bonded to an unetched channel substrate material such that channels 42 are at least partially defined between the etched channel substrate material and the unetched channel substrate material by the predefined width or depth etched into and along the length of the etched channel substrate material. In various examples, etched and unetched channel substrate materials bonded together in this manner may be stacked and bonded to one another to form one or more of the walls 22 of the body 20 of the apparatus 10. Forming channels 42 in this manner may avoid further etching (e.g., wet etching, dry etching, without limitation) of the etched or unetched channel substrate materials to form the channels 42 therebetween. More particularly, this alternative approach allows the width or depth of the channels 42 to be predefined by masking and etching the channel substrate materials prior to bonding to one another, thereby avoiding subsequent etching (e.g., etching an oxide material). This approach is made possible by the liner coating, which allows greater channel widths to be utilized, such that DRIE provides sufficient control to accurately define the etch width or depth into channel substrate material.

In various examples, the portion of the wall 22 or walls 22 on which the channel 42 or channels 42 are disposed may be concentrated in a single discrete portion of the wall 22 or walls 22. In other examples, the walls 22 may include channels 42 in multiple different portions of the walls 22. By way of example, a single discrete portion, multiple different portions, a total surface area occupied by all portions of the wall 22 or walls 22, the shapes of the portions, the positions of the portions, as well as the configurations and dimensions of the channels 42 in the portion or portions, or any combination or subcombination of these configurations may be selected to control (e.g., maintain, without limitation) the vapor pressure of a subject material 30 (e.g., alkali-metals, such as cesium, alkaline earth metals, such as strontium, or other metals, such as ytterbium, without limitation) contained in the cavity 26 of the apparatus 10 within predetermined thresholds based upon anticipated operating conditions of the apparatus 10.

As illustrated in FIG. 1, one or more walls 22 at least partially defining the cavity 26 include channels 42 exposed to the subject material 30 (e.g., alkali-metals, such as cesium, alkaline earth metals, such as strontium, or other metals, such as ytterbium, without limitation) contained in the cavity 26, while other walls 22 at least partially defining the cavity 26 lack channels 42. For example, one, some, or all of the walls 22 may be porous or have a surface roughness to form channels 42 exposed to subject material 30 in the cavity 26, and one or some of the walls 22 may be nonporous.

FIG. 2 is an enlarged, schematic cross-sectional view of a portion of the channel structure 40 enclosed by dashed box 2 in FIG. 1. As shown in FIG. 1, the channel structure 40 includes channels 42 disposed over substantially the entirety of one wall 22 of the apparatus 10, which are exposed to the subject material 30 (e.g., alkali-metals, such as cesium, alkaline earth metals, such as strontium, or other metals, such as ytterbium, without limitation) contained in the cavity 26 of the apparatus 10. The channels 42 may exhibit a width 46 (e.g., uniform width, substantially uniform width, without limitation), for example, of from about 10 nm to about 10,000 nm. More specifically, the width 46 of the channels 42 exposed to the subject material 30 contained in a cavity 26 may be, for example, from about 500 nm to about 5,000 nm (e.g., about 500 nm, about 1,000 nm, about 1,500 nm, about 2,500 nm, about 5,000 nm, without limitation), as measured in a direction perpendicular to the sidewalls 43 on the respective channel 42. As a specific, nonlimiting example, the width 46 of the channels 42 exposed to the subject material 30 in the cavity 26 may be, for example, about 1,000 nm.

The channels 42 include internal surfaces, for example, sidewalls 43 and closed bottoms 44, as shown in FIG. 2. In various examples, the internal surfaces of the respective channels 42 (e.g., sidewalls 43 and closed bottoms 44, without limitation) form channels 42 having an elongated rectangular configuration (e.g., an elongated substantially rectangular configuration, without limitation). In some other examples, the channels 42 extend along the portion or portions of the wall 22 or walls 22 of the apparatus 10 in a linear orientation (e.g., substantially linear orientation, without limitation).

The channel structure 40 may include a channel substrate 41 in which the sidewalls 43 of the channels 42 are formed. In various examples, the channel substrate 41 may comprise silicon (e.g., silicon wafer, without limitation), and the channels 42 may be formed in the channel substrate 41 having widths 46 (e.g., uniform widths, substantially uniform widths, without limitation) of about 1,000 nm by way of a suitable removal process (e.g., deep reactive ion etching (DRIE), without limitation). The channels 42 formed in the channel substrate 41 may exhibit a depth 47, as also shown in FIG. 2. The depth 47 of the channels 42 is the distance from the closed bottoms 44 of the channels 42 to the upper ends 49 of the projections of the channel substrate 41 extending between the channels 42. The depth 47 of the channels 42 may be from about 100 nm to about 100,000 nm, without limitation. An offset 48 between adjacent ones of the channels 42 is defined (e.g., partially defined, substantially defined, without limitation) by the width of the upper ends 49 of the projections of the channel substrate 41 extending between the channels 42.

The channels 42 exhibit widths 46 (e.g., uniform widths, substantially uniform widths, without limitation) which are configured to cause a meniscus 32 of the subject material 30 (e.g., alkali-metals, such as cesium, alkaline earth metals, such as strontium, or other metals, such as ytterbium, without limitation) while in a liquid state within the channels 42 to also have a uniform shape, wherein the uniform shape (e.g., uniform meniscus 32, without limitation) of the subject material 30 within the channels 42 is different than a shape the subject material 30 in a liquid state would have on a level (e.g., substantially level, without limitation) nonporous (e.g., substantially nonporous, without limitation) surface under the same operating conditions (e.g., same temperature, same pressure, without limitation). For example, a radius of the meniscus 32 of the subject material 30 in the liquid state within the channels 42 having widths 46 may be negative (i.e., the meniscus 32 may be concave, without limitation). More specifically, the size and shape of the uniform channels 42 may induce the meniscus 32 of the subject material 30 in the liquid state to exhibit a uniform concave shape through capillary action, such that the height of the subject material 30 from the respective closed bottoms 44 in the center of the channels 42 is less than the height of the subject material 30 from the respective closed bottoms 44 near the sidewalls 43 of the channels 42 having widths 46, as is shown in FIG. 2.

Controlling (e.g., altering, without limitation) the shape of the meniscus 32 of the subject material 30 (e.g., alkali-metals, such as cesium, alkaline earth metals, such as strontium, or other metals, such as ytterbium, without limitation) in the liquid state within the channels 42 controls the vapor pressure of the subject material 30 within the cavity 26. For example, inducing the meniscus 32 of the subject material 30 in the liquid state within the cavity 26 to have a negative radius (e.g., a concave meniscus 32, without limitation) may cause the vapor pressure of the subject material 30 within the cavity 26 to be less than a saturation pressure of the subject material 30 in a vapor state within the cavity 26. More specifically, the size and shape of the channels 42 having widths 46 (e.g., uniform widths, substantially uniform widths, without limitation), and the corresponding size and shape of the meniscus 32 of the subject material within the channels 42, may cause a greater proportion of the subject material 30 within the cavity 26 to be in the liquid state than would be in the liquid state absent the channels 42.

A channel structure 40 may have a liner material 50 disposed over at least a portion of the channels 42 of the channel structure 40. More particularly, the liner material 50 may be disposed over at least the sidewalls 43 of channels 42 of the channel structure 40. In various examples, the liner material 50 may be disposed over other portions of the channels 42 (e.g., closed bottoms 44, without limitation) so long as the liner material 50 is substantially uniform at least over the sidewalls 43 of the channels 42 of the channel structure 40. In various examples, a channel structure 40 may include a liner material 50 disposed over the channels 42 of the channel structure 40, wherein the liner material 50 may exhibit a thickness 52 (e.g., uniform thickness, substantially uniform thickness, without limitation) over the sidewalls 43 and closed bottoms 44 of the channels 42, as well as over the upper ends 49 of the projections of the channel substrate 41 extending between the channels 42, as shown in FIG. 2. A liner material 50 may have a uniform thickness in a range of from about 10 nm to about 1,000 nm. In various examples, the liner material 50 exhibits a substantially uniform thickness 52 over at least the sidewalls 43 of the channels 42 of the channel structure 40 to assure that the channels 42 of the channel structure 40 exhibit uniform lined channel widths 54 (e.g., substantially uniform lined channel widths, without limitation).

The liner material 50 may be formed of a material on which the subject material 30 (e.g., alkali-metals, such as cesium, alkaline earth metals, such as strontium, or other metals, such as ytterbium, without limitation) exhibits a lower wetting angle (e.g., about 50% lower, about 60% lower, about 75% lower, without limitation) than the subject material 30 exhibits on the underlying channel substrate 41 under the same operating conditions (e.g., same temperature, same pressure, without limitation). In various examples, the underlying channel substrate 41 comprises silicon (e.g., silicon wafer, without limitation) and the subject material 30 comprises an alkali metal (e.g., cesium, without limitation) which exhibits a wetting angle of about 70 degrees on the silicon material of the channel substrate 41. In other examples, the liner material 50 comprises a metal or metal alloy (e.g., noble metal, platinum, without limitation) on which the subject material 30 (e.g., cesium, without limitation) exhibits a reduced wetting angle of about 30 degrees on the liner material 50.

The reduction in the wetting angle of the subject material 30 (e.g., alkali-metals, such as cesium, alkaline earth metals, such as strontium, or other metals, such as ytterbium, without limitation) on the liner material 50 allows the widths 46 (e.g., uniform widths, substantially uniform widths, without limitation) of the channels 42 to be increased while maintaining the target vapor pressure suppression (e.g., vapor pressure suppression equivalent to about 25 °C, without limitation). The suppression of the vapor pressure of the subject material 30 may result in a reduction in the accumulation of the subject material 30 on the windows 24 of the apparatus 10 itself. The increase in the widths 46 of the channels 42 allows for reliable and repeatable automated fabrication (e.g., DRIE, without limitation) of a channel structure 40 having channels 42 with uniform widths 46 (e.g., uniform widths of about 1,000 nm, substantially uniform widths of about 1,000 nm, without limitation).

Figure 5:
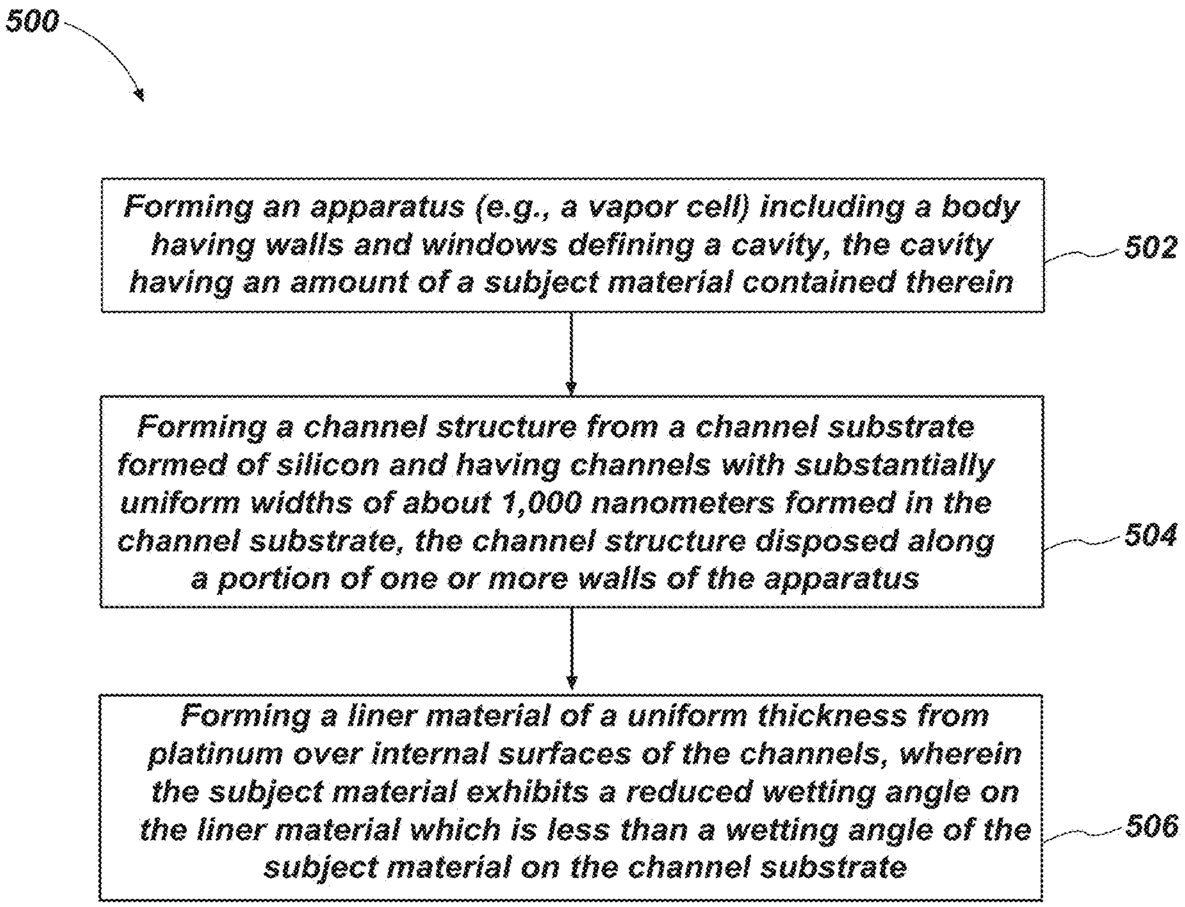
FIG. 5 is a flowchart depicting one example of an illustrative method of making an apparatus for controlling vapor pressure of a subject material contained therein, in accordance with examples of the disclosure.

FIG. 5 is a flowchart depicting one example of an illustrative method 500 of making an apparatus. The method 500 may involve, for example, forming or providing an apparatus, such as a vapor cell, without limitation, including a body having walls and windows defining a cavity therebetween, the cavity having an amount of a subject material (e.g., alkali-metals, such as cesium, alkaline earth metals, such as strontium, or other metals, such as ytterbium, without limitation) contained therein, as indicated at act 502. As specific, nonlimiting examples, the body of the apparatus may take any of the forms and may include any of the materials previously described in connection with the apparatus 10 of FIGS. 1 through 4.

The method 500, in various examples, also includes forming a channel structure from a channel substrate formed of silicon having channels with substantially uniform widths of about 1,000 nm formed therein, the channel structure disposed along a portion of one or more of the walls of the apparatus, as indicated at act 504.

With continued reference to FIG. 5, the method 500 of making an apparatus further includes forming a liner material of a uniform thickness from platinum over portions of the internal surfaces of the channels, wherein the subject material (e.g., alkali-metals, such as cesium, alkaline earth metals, such as strontium, or other metals, such as ytterbium, without limitation) exhibits a reduced wetting angle on the liner material which is less than a wetting angle of the subject material on the channel substrate, as indicated at act 506.

Figure 6:
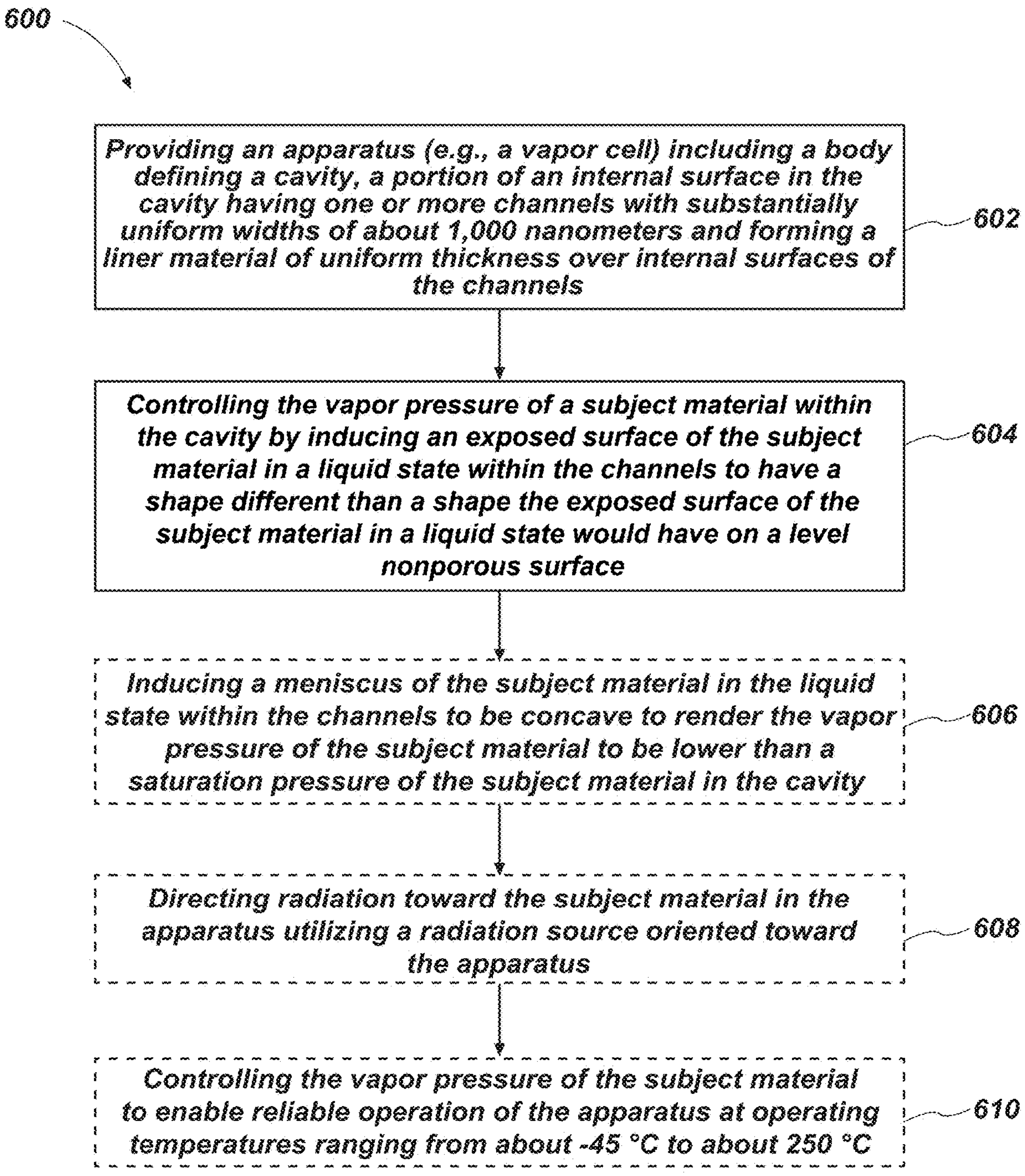
FIG. 6 is a flowchart depicting one example of an illustrative method of using an apparatus for controlling vapor pressure of a subject material contained therein, in accordance with examples of the disclosure.

FIG. 6 is a flowchart depicting an example of an illustrative method 600 of using an apparatus (e.g., vapor cell, atomic sensor, atomic clock, such as a chip-scale atomic clock, atomic magnetometer, such as a chip-scale atomic magnetometer, atomic gyroscope, without limitation). The method 600 may involve, for example, providing an apparatus having a body defining a cavity within the body, as shown at act 602. At least a portion of at least one surface within the cavity including one or more channels having substantially uniform widths of from about 500 nm to about 5,000 nm. In accordance with various examples, at least a portion of at least one surface within the cavity includes one or more channels having substantially uniform widths of about 1,000 nm and having a liner material of uniform thickness over internal surfaces of the channels, as also shown at act 602. In various examples, the at least one surface within the cavity including the channels may be a wall (e.g., sidewall, without limitation) of a body of the apparatus at least partially defining the cavity. In other examples, the at least one surface within the cavity including the channels may be a channel structure discrete from the body and located within the cavity.

The vapor pressure of the subject material (e.g., alkali-metals, such as cesium, alkaline earth metals, such as strontium, or other metals, such as ytterbium, without limitation) within the cavity may be controlled, as indicated at act 604. Controlling the vapor pressure may be achieved by, for example, providing an amount of the subject material within the cavity of the body with the one or more channels, and ensuring that the amount of the subject material within the cavity is insufficient to fully saturate (e.g., to fully occupy) the one or more channels under anticipated operating conditions. A pressure and a temperature within the cavity may be controlled (e.g., by inducing a selected pressure within the cavity, by transferring heat to or from the cavity, by exposing the apparatus to conditions in the operating environment) to induce a portion of the subject material to be in a vapor state within the cavity and a different portion of the subject material to be in a liquid state within the one or more channels. In various examples, an exposed surface of the subject material in a liquid state within the one or more channels may be induced to have a shape different than a shape the exposed surface of the subject material in a liquid state would have on a level nonporous surface, as also indicated at act 604. More specifically, in various examples, a meniscus of the subject material in the liquid state may be induced to be concave, as further indicated at act 606, to render a vapor pressure of the subject material lower than a saturation pressure of the subject material in the cavity. As a specific, nonlimiting example, the uniform size, shape, and position of the one or more channels within the cavity may induce the subject material in the liquid state within the channels to have a concave shape through capillary action.

In various examples, directing radiation toward the subject material (e.g., alkali-metals, such as cesium, alkaline earth metals, such as strontium, or other metals, such as ytterbium, without limitation) within the apparatus may be accomplished utilizing a radiation source oriented toward the apparatus, as indicated at act 608.

In various examples, controlling the vapor pressure of the subject material may enable reliable operation of an atomic sensor, an atomic clock, an atomic magnetometer, an atomic gyroscope, without limitation, incorporating the apparatus at operational temperatures ranging from about −45 °C to about 250 °C, as indicated at act 610.

When operating an apparatus in accordance with this disclosure, the cavity of the apparatus may be placed in the path of radiation emitted by a radiation source such that a subject material (e.g., alkali-metals, such as cesium, alkaline earth metals, such as strontium, or other metals, such as ytterbium, without limitation) within the cavity may be impacted (e.g., excited) by incident radiation. The inclusion of one or more channels may enable the vapor pressure of the subject material to be controlled relative to the saturation pressure of the subject material. A meniscus of the subject material in a liquid state within the one or more channels may be induced to have a different shape from a shape the subject material would have in the liquid state on a level nonporous surface, which may affect the vapor pressure of the subject material.

Figure 7A:
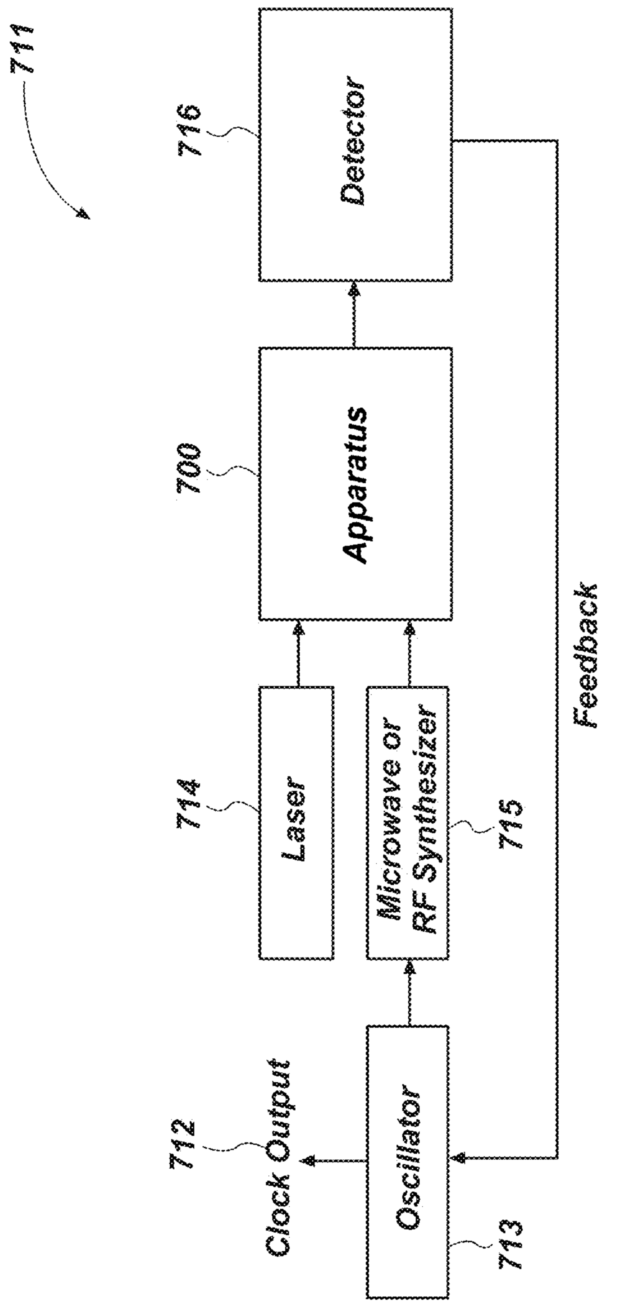
FIGS. 7A and 7B are schematic diagrams of examples of illustrative systems including an apparatus for controlling vapor pressure of a subject material contained therein, in accordance with examples of the disclosure.
Figure 7B:
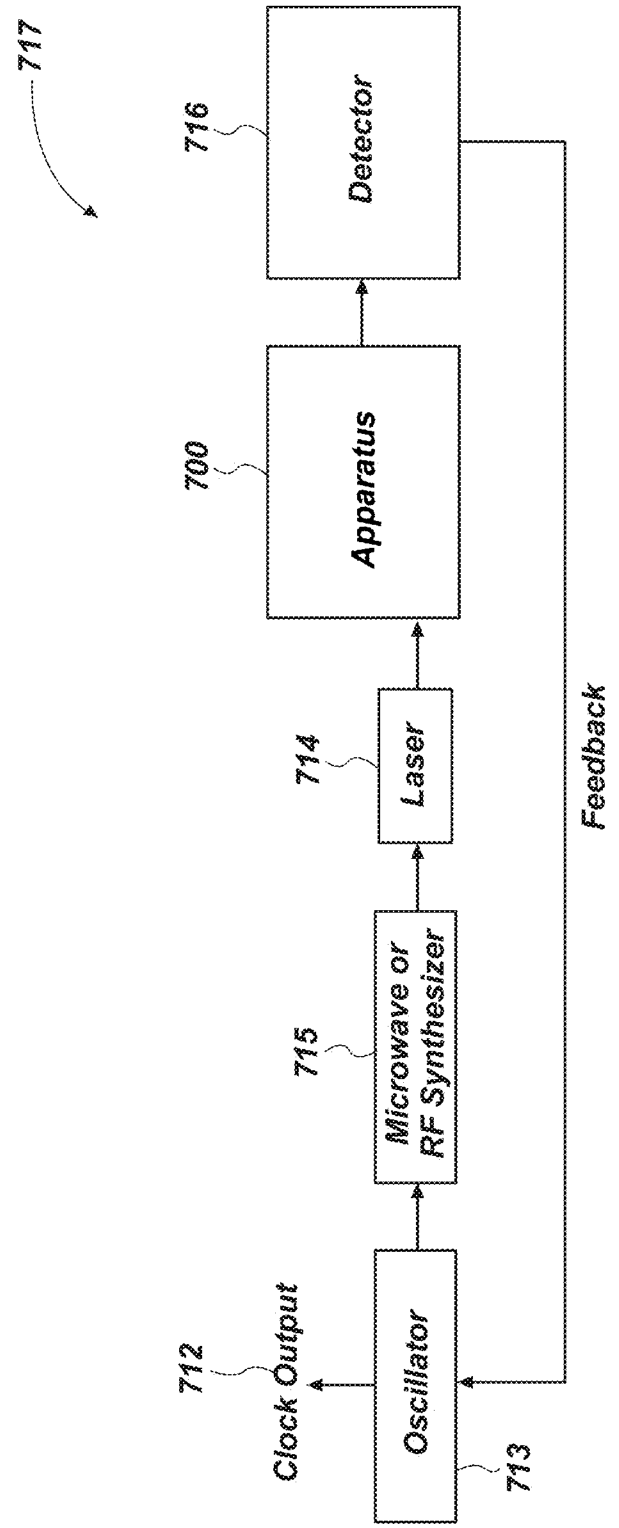

FIGS. 7A and 7B are schematics of illustrative systems 711 and 717, respectively, including an apparatus 700 in accordance with examples of the disclosure (e.g., vapor cell, atomic sensor, atomic clock, such as a chip-scale atomic clock, atomic magnetometer, such as a chip-scale atomic magnetometer, atomic gyroscope, without limitation), differing in whether microwaves are applied directly to the apparatus 700, as in a microwave-optical double-resonance clock or an Mx magnetometer shown in system 711, or applied as modulation to the laser bias current, as in a clock based on coherent population trapping or a Bell-Bloom type magnetometer shown in system 717. The systems 711 and 717 may be, for example, atomic sensors, atomic clocks, atomic magnetometers, or atomic gyroscopes, without limitation.

The apparatus 700 may include an examination region in which the vaporized atoms of the subject material (e.g., alkali-metals, such as cesium, alkaline earth metals, such as strontium, or other metals, such as ytterbium, without limitation) may be contained, and one or more emitters (e.g., an emitter 714 (e.g., a laser, without limitation) or an emitter 715 (e.g., a microwave, an RF synthesizer, without limitation)), or both emitter 714 and emitter 715 may direct energy of a defined type and intensity toward the examination region. A detector 716 may include a sensor to detect one or more properties of the vaporized atoms of the subject material in response to the emitted energy. For example, the sensor of the detector 716 may be oriented toward the examination region and detect the transition of the subject material between energy levels, responsive to the energy from the emitter 714, as measured in variation of signal strengths relative to the frequency of the microwaves emitted by the emitter 715.

One or more signals representative of the properties measured by the detector 716 may be provided as feedback to an oscillator 713. The oscillator 713 may generate a clock output 712, which may be used as a clock signal itself or may be used to verify or synchronize a different clock signal. In other words, the oscillator 713 may generate a clock output 712 timed to a frequency corresponding to the rate at which the atoms of the subject material (e.g., alkali-metals, such as cesium, alkaline earth metals, such as strontium, or other metals, such as ytterbium, without limitation) transition between energy levels in response to changes in the frequency of radiation from the emitter 715 (e.g., a microwave, an RF synthesizer, without limitation) as detected by corresponding changes in the frequency of the energy from the emitter 714 (e.g., a laser, without limitation). The oscillator 713 may also be used to generate/synthesize radiation from the emitter 715.

Such a system 711 or 717 may be particularly useful for generating, verifying, or synchronizing clock signals of high accuracy or in extreme environmental conditions (e.g., near vacuum, low or micro gravity, near earth orbit or space). Systems 711 and 717 in accordance with this disclosure may find application in the aerospace industry (e.g., to control clock signals in satellites and spacecraft), the telecom and banking industries (e.g., to verify or set clock signals for relevant computing systems), and in standard-setting situations (e.g., to establish timings for relevant standards). By reducing the vapor pressure of the subject material (e.g., alkali-metals, such as cesium, alkaline earth metals, such as strontium, or other metals, such as ytterbium, without limitation) in the apparatus 700 of the system 711 or 717, the system 711 or 717 can operate over a wider range of ambient temperatures.

Additional non-limiting examples of the disclosure include:

Example 1: An apparatus, comprising: a body having walls defining a cavity therebetween, the cavity containing an amount of a subject material; a channel structure comprising a channel substrate with channels having a substantially uniform width formed therein, the channel structure disposed along a portion of the walls; and a liner material disposed over portions of internal surfaces of the channels.

Example 2: The apparatus according to Example 1, wherein the body includes oppositely disposed windows between the walls.

Example 3: The apparatus according to any of Examples 1 and 2, wherein the channel structure is integrally formed in the portion of the walls.

Example 4: The apparatus according to any of Examples 1 through 3, wherein the channels comprise an elongated configuration.

Example 5: The apparatus according to any of Examples 1 through 4, wherein the channels are disposed continuously along and around the walls of the body.

Example 6: The apparatus according to any of Examples 1 through 5, wherein the channel substrate comprises silicon.

Example 7: The apparatus according to any of Examples 1 through 6, wherein the channels are formed in the channel substrate by deep reactive ion etching.

Example 8: The apparatus according to any of Examples 1 through 7, wherein the substantially uniform width of the channels is from about 500 nanometers to about 5,000 nanometers.

Example 9: The apparatus according to any of Examples 1 through 8, wherein the substantially uniform width of the channels is about 1,000 nanometers.

Example 10: The apparatus according to any of Examples 1 through 9, wherein the internal surfaces of the channels include a bottom and sidewalls.

Example 11: The apparatus according to any of Examples 1 through 10, wherein the liner material is disposed over the sidewalls of the channels.

Example 12: The apparatus according to any of Examples 1 through 11, wherein the liner material comprises a uniform thickness over the sidewalls of the channels.

Example 13: The apparatus according to any of Examples 1 through 12, wherein the subject material exhibits a wetting angle on the liner material which is less than a wetting angle of the subject material on the channel substrate.

Example 14: The apparatus according to any of Examples 1 through 13, wherein the liner material comprises a metal or a metal alloy.

Example 15: The apparatus according to any of Examples 1 through 14, wherein the liner material comprises platinum.

Example 16: The apparatus according to any of Examples 1 through 15, wherein the subject material comprises an alkali metal.

Example 17: The apparatus according to any of Examples 1 through 16, wherein portions of the subject material disposed within the channels exhibit a meniscus having a uniform shape.

Example 18: The apparatus according to any of Examples 1 through 17, wherein portions of the subject material disposed within the channels exhibit a concave meniscus.

Example 19: The apparatus according to any of Examples 1 through 18, wherein the concave meniscus of the portions of the subject material disposed within the channels causes a vapor pressure of the subject material to be less than a saturation pressure of the subject material in a vapor state within the cavity.

Example 20: A method, the method comprising: forming an apparatus including a body having walls defining a cavity therebetween, the cavity having an amount of a subject material contained therein; forming a channel structure from a channel substrate formed of silicon and having channels with a substantially uniform width of about 1,000 nanometers formed therein, the channel structure disposed along a portion of one or more of the walls of the apparatus; and forming a liner material comprising a uniform thickness from platinum over portions of internal surfaces of the channels, wherein the subject material exhibits a reduced wetting angle on the liner material which is less than a wetting angle of the subject material on the channel substrate.

Example 21: The method according to Example 20, wherein forming the apparatus including the body having walls defining the cavity therebetween comprises forming the apparatus including the body having walls and oppositely disposed windows defining the cavity therebetween.

Example 22: The method according to any of Examples 20 and 21, wherein forming the channel structure from the channel substrate formed of silicon and having the channels with the substantially uniform width of about 1,000 nanometers formed therein comprises forming the channel structure from the channel substrate formed of silicon and having the channels with the substantially uniform width of about 1,000 nanometers formed therein by deep reactive ion etching.

Example 23: The method according to any of Examples 20 through 22, wherein forming the liner material comprising the uniform thickness from platinum over the portions of the internal surfaces of the channels comprises forming the liner material comprising the uniform thickness from platinum over sidewalls of the channels.

Example 24: The method according to any of Examples 20 through 23, wherein forming the liner material comprising the uniform thickness from platinum over the portions of the internal surfaces of the channels comprises forming the liner material comprising the uniform thickness from platinum over the portions of the internal surfaces of the channels by atomic layer deposition.

Example 25: A system, comprising: an emitter positioned and oriented to direct radiation into and through an apparatus, wherein the apparatus comprises: a body having walls and windows defining a cavity therebetween and an amount of a subject material disposed in the cavity; a channel structure comprising a channel substrate with channels having a substantially uniform width formed therein, the channel structure disposed along a portion of the walls; a liner material having a uniform thickness disposed over internal surfaces of the channels, the subject material exhibiting a wetting angle on the liner material which is less than a wetting angle of the subject material on the channel substrate; and a detector positioned and oriented to detect the radiation directed into and through the windows of the apparatus.

While certain illustrative examples have been described in connection with the figures, the scope of this disclosure is not limited to those examples explicitly shown and described in this disclosure. Rather, many additions, deletions, and modifications to the examples described in this disclosure may be made to produce examples within the scope of this disclosure, such as those specifically claimed, including legal equivalents. In addition, features from a disclosed example may be combined with features of a different disclosed example while still being within the scope of this disclosure.

What is claimed is:

1. An apparatus, comprising:

a body having walls defining a cavity therebetween, the cavity containing an amount of a subject material;

a channel structure comprising a channel substrate in which channels having a substantially uniform width are formed, the channels formed in the channel substrate disposed continuously along and around the walls of the body; and a liner material disposed over portions of internal surfaces of the channels, wherein the subject material exhibits a wetting angle on the liner material which is less than a wetting angle of the subject material on the channel substrate.

2. The apparatus of claim 1, wherein the body includes oppositely disposed windows between the walls.

3. The apparatus of claim 1, wherein the channel structure is integrally formed in the portion of the walls.

4. The apparatus of claim 1, wherein the channels comprise an elongated configuration.

5. The apparatus of claim 1, wherein the channel substrate comprises silicon.

6. The apparatus of claim 5, wherein the channels are formed in the channel substrate by deep reactive ion etching.

7. The apparatus of claim 1, wherein the substantially uniform width of the channels is from about 500 nanometers to about 5,000 nanometers.

8. The apparatus of claim 1, wherein the substantially uniform width of the channels is about 1,000 nanometers.

9. The apparatus of claim 1, wherein the internal surfaces of the channels include a bottom and sidewalls.

10. The apparatus of claim 9, wherein the liner material is disposed over the sidewalls of the channels.

11. The apparatus of claim 10, wherein the liner material comprises a uniform thickness over the sidewalls of the channels.

12. The apparatus of claim 1, wherein the liner material comprises a metal or a metal alloy.

13. The apparatus of claim 1, wherein the liner material comprises platinum.

14. The apparatus of claim 1, wherein the subject material comprises an alkali metal.

15. The apparatus of claim 1, wherein portions of the subject material disposed within the channels exhibit a meniscus having a uniform shape.

16. The apparatus of claim 1, wherein portions of the subject material disposed within the channels exhibit a concave meniscus.

17. The apparatus of claim 16, wherein the concave meniscus of the portions of the subject material disposed within the channels causes a vapor pressure of the subject material to be less than a saturation pressure of the subject material in a vapor state within the cavity.

18. A method, the method comprising:

forming an apparatus including a body having walls defining a cavity therebetween, the cavity having an amount of a subject material contained therein;

forming a channel structure from a channel substrate formed of silicon and having channels with a substantially uniform width of about 1,000 nanometers formed therein, the channel structure disposed along a portion of one or more of the walls of the apparatus; and forming a liner material comprising a uniform thickness from platinum over portions of internal surfaces of the channels, wherein the subject material exhibits a reduced wetting angle on the liner material which is less than a wetting angle of the subject material on the channel substrate.

19. The method of claim 18, wherein forming the apparatus including the body having walls defining the cavity therebetween comprises forming the apparatus including the body having walls and oppositely disposed windows defining the cavity therebetween.

20. The method of claim 18, wherein forming the channel structure from the channel substrate formed of silicon and having the channels with the substantially uniform width of about 1,000 nanometers formed therein comprises forming the channel structure from the channel substrate formed of silicon and having the channels with the substantially uniform width of about 1,000 nanometers formed therein by deep reactive ion etching.

21. The method of claim 18, wherein forming the liner material comprising the uniform thickness from platinum over the portions of the internal surfaces of the channels comprises forming the liner material comprising the uniform thickness from platinum over sidewalls of the channels.

22. The method of claim 18, wherein forming the liner material comprising the uniform thickness from platinum over the portions of the internal surfaces of the channels comprises forming the liner material comprising the uniform thickness from platinum over the portions of the internal surfaces of the channels by atomic layer deposition.

23. A system, comprising:

an emitter positioned and oriented to direct radiation into and through an apparatus, wherein the apparatus comprises:

a body having walls and windows defining a cavity therebetween and an amount of a subject material disposed in the cavity;

a channel structure comprising a channel substrate in which channels having a substantially uniform width are formed, the channels formed in the channel substrate disposed continuously along and around the walls of the body;

a liner material having a uniform thickness disposed over internal surfaces of the channels, the subject material exhibiting a wetting angle on the liner material which is less than a wetting angle of the subject material on the channel substrate; and a detector positioned and oriented to detect the radiation directed into and through the windows of the apparatus.

* * * * *